United States Patent [19]
Wheelus et al.

[11] Patent Number: 5,677,917
[45] Date of Patent: Oct. 14, 1997

[54] INTEGRATED CIRCUIT MEMORY USING FUSIBLE LINKS IN A SCAN CHAIN

[75] Inventors: Richard A. Wheelus, Austin; Todd D. Haverkos, Round Rock; Kenneth W. Jones, Austin, all of Tex.

[73] Assignee: Motorola, Inc., Schaumburg, Ill.

[21] Appl. No.: 641,151

[22] Filed: Apr. 29, 1996

[51] Int. Cl.[6] .................................................. G01R 31/38
[52] U.S. Cl. ................................. 371/22.3; 371/22.1
[58] Field of Search ............................ 371/22.3, 21.1, 371/22.2, 22.5, 22.6, 22.1

[56] References Cited

U.S. PATENT DOCUMENTS

| | | | |
|---|---|---|---|
| 4,346,459 | 8/1982 | Sud et al. | 365/200 |
| 4,853,946 | 8/1989 | Elliott et al. | 378/4 |
| 5,337,277 | 8/1994 | Jang | 365/200 |
| 5,365,310 | 11/1994 | Jenkins et al. | 355/202 |

*Primary Examiner*—Hoa T. Nguyen
*Attorney, Agent, or Firm*—Daniel D. Hill

[57] ABSTRACT

An integrated circuit memory (140) includes programmable fuses (20) coupled to scannable flip-flops (25). The programmable fuses (20) and scannable flip-flops (25) are implemented in a scan chain, and are used to program specific information about the integrated circuit memory (140), such as for example, repair (redundancy) information, wafer lot number and wafer number, die position on the wafer, or any other information that would be useful during or after package testing.

18 Claims, 5 Drawing Sheets

INTEGRATED CIRCUIT MEMORY USING FUSIBLE LINKS IN A SCAN CHAIN

FIELD OF THE INVENTION

This invention relates generally to memories, and more particularly, to an integrated circuit memory using fusible links in a scan chain.

BACKGROUND OF THE INVENTION

As the memory storage capacity of integrated circuit memories increases, the possibility of having manufacturing defects in the rows and columns increases. And this results in a decrease in production yields. One way to increase production yields in large integrated circuit memories is to use column and row redundancy. In an integrated circuit memory with redundancy, a manufacturing defect in a particular row can be cured by using a redundant row in place of the defective row. Likewise, a defect in a particular column can be cured by using a redundant column to replace the defective column. To implement column and row redundancy, redundant control logic and redundant read/write data paths are also required.

In order to repair a defective row or column, the defective row or column is deselected and a redundant row or column is assigned in its place by blowing fusible links. The fusible links may be blown using a high-energy laser, or may be blown electrically at wafer level test. The ability to repair a memory that has only a few defective rows or columns can result in substantially increased manufacturing yields.

On integrated circuits that include a memory array with redundancy, it may be necessary to detect, after assembly of the integrated circuit, whether or not redundancy has been used to repair the memory array. Among other things, repair information is important for analyzing test yield, debugging failure modes, and to analyze certain customer returns. However, determining if redundancy has been used typically requires deprocessing the integrated circuit for a visual inspection of the fuses used to implement the redundancy. Deprocessing is time consuming and destroys the integrated circuit memory.

One other way to determine whether or not redundant elements have been used to repair a memory array has been to add an extra fuse in the layout that is blown to indicate when the memory array has been repaired. The fuse is coupled between an input pin and ground and causes a current surge, or spike, on power-up. Once a power-up clear, or power OK signal is received, the current spike ceases. However, the additional fuse only indicates that redundancy has been used, and does not provide any other details, such as for example, which addresses of the memory array had to be repaired.

DESCRIPTION OF A PREFERRED EMBODIMENT

Generally, the present invention provides an integrated circuit having a memory array, with programmable fuses coupled to scannable flip-flops, or latch circuits. The programmable fuses and scannable flip-flops are used to program predetermined information about the integrated circuit, such as for example, repair (redundancy) information, wafer lot number and wafer number, die position on the wafer, or any other information that would be useful during or after package testing.

Specifically, in one embodiment on an integrated circuit memory, scannable latches, or flip-flops, are coupled to the redundancy fuses normally blown with a laser at wafer probe to replace defective rows or columns with redundant rows or columns. The repaired addresses can then be scanned out during package testing indicating exactly which row or column was repaired. In another embodiment, additional fuses are coupled to scannable latches that are blown at wafer probe. The additional fuses can be blown to encode any information about the integrated circuit memory, including redundancy, wafer lot information, die position on the wafer, wafer parametrics, etc. This information can then be used to analyze yield and failure modes. On integrated circuits having both logic circuits and a memory array, the scannable flip-flops can be incorporated into the existing scan chain that is used to test the logic circuits. For example, the existing scan chain may include boundary scan testing that is compliant with IEEE 1149.1, and revisions thereof, commonly known as JTAG (Joint Test Action Group). Also, the scannable flip-flops may be incorporated as a stand-alone scan chain.

Figure 1:
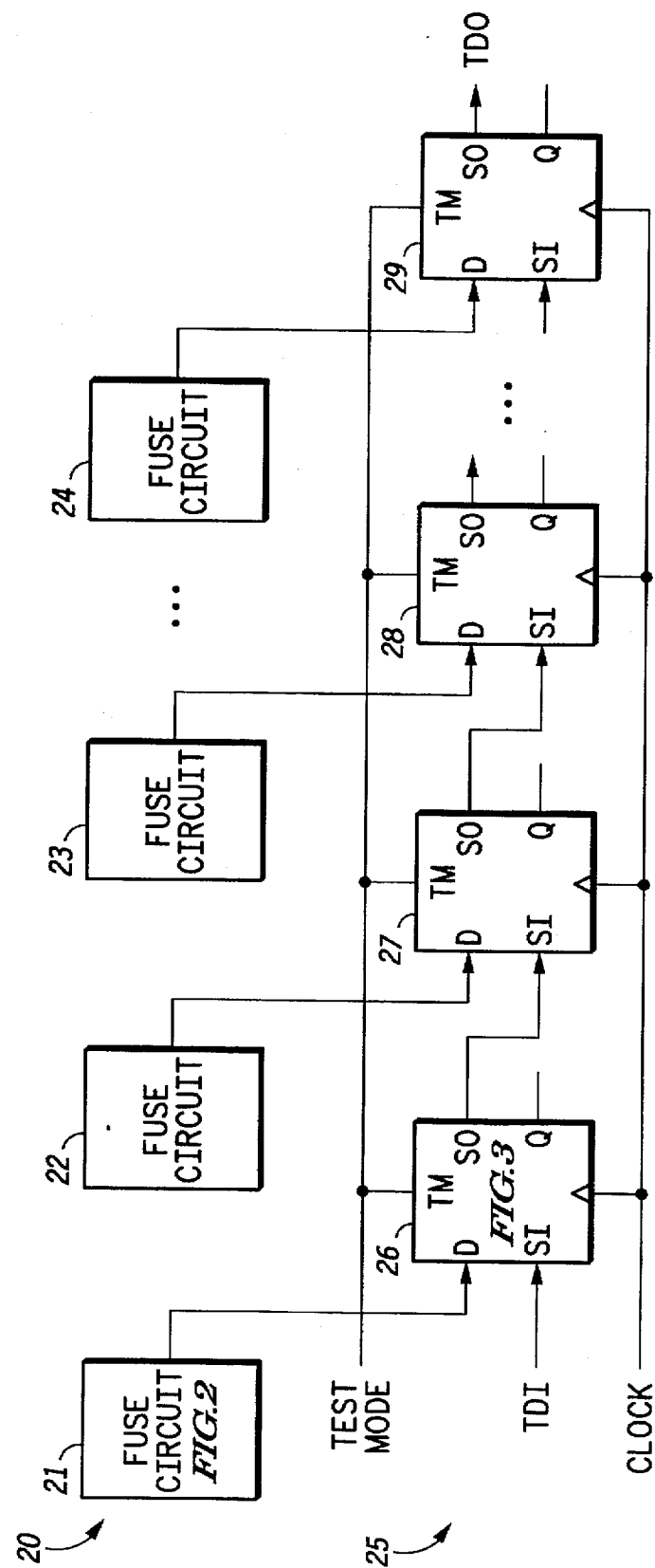
FIG. 1 illustrates, in block diagram form, a scan chain in accordance with one embodiment of the present invention.
Figure 2:
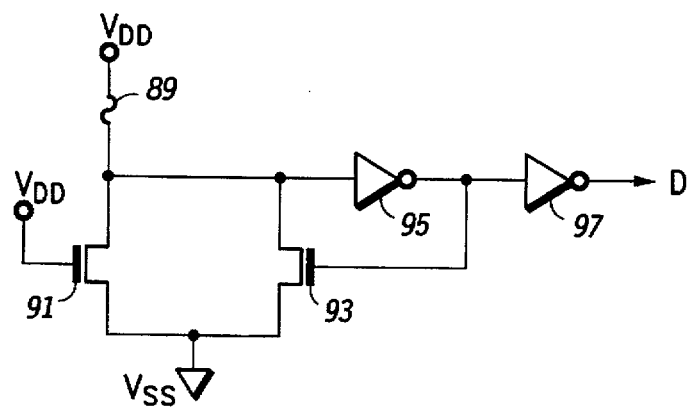
FIG. 2 illustrates, in partial schematic diagram form and partial logic diagram form, a fuse circuit of the scan chain of FIG. 1.

The present invention can be more fully described with reference to FIGS. 1–6. FIG. 1 illustrates, in block diagram form, a scan chain 10 in accordance with one embodiment of the present invention. Scan chain 10 includes a plurality of fuse circuits 20 and a plurality of scannable flip-flops 25. The plurality of fuse circuits 20 includes fuse circuits 21–24. Fuse circuit 21 is illustrated in FIG. 2 in more detail. The plurality of scannable flip-flops includes scannable flip-flops 26–29. Each of scannable flip-flops 25 includes a first input terminal labeled "D", a test mode terminal labeled "TM" for receiving an externally generated test mode signal labeled "TEST MODE", a scan-in terminal labeled "SI", a scan-out terminal labeled "SO", a clock terminal for receiving a clock signal labeled "CLOCK", and an output terminal labeled "Q". Scannable flip-flop 26 is illustrated in more detail in FIG. 3.

Fuse circuit 21 has an output terminal connected to the "D" terminal of scannable flip-flop 26. The scan-out terminal of scannable flip-flop 26 is connected to the scan-in terminal of scannable flip-flop 27. The scan-in terminal of scannable flip-flop 26 receives externally generated shifted-in test data labeled "TDI". Fuse circuit 22 has an output terminal connected to the "D" terminal of scannable flip-flop 27. The scan-out terminal of scannable flip-flop 27 is connected to the scan-in terminal of scannable flip-flop 28. Fuse circuit 23 has an output terminal connected to the "D" terminal of scannable flip-flop 28. The scan-out terminal of scannable flip-flop 28 is connected to the scan-in terminal of the next scannable flip-flop in the plurality of scannable flip-flops 25. Fuse circuit 24 has an output terminal connected to the "D" terminal of scannable flip-flop 29. The scan-out terminal of scannable flip-flop 29 provides a test data out signal labeled "TDO" to an output terminal, or pin, of the integrated circuit. The scan-out terminal of a preceding scannable flip-flop in the plurality of scannable flip-flops 25 is connected to the scan-in terminal of each succeeding scannable flip-flop. The number of scannable flip-flops in the plurality of scannable flip-flops 25, and the corresponding number of fuses can be any number, as indicated by the ampersands, and depends on how many bits of data is to be stored by the fuse circuits.

In operation, each of the plurality of fuse circuits 20 will store one bit of information. In response to test mode signal TEST MODE being a logic high, fuse circuits 21, 22, 23, and 24 provide a predetermined logic state representative of the state of a fusible link (illustrated in FIG. 2) to the D input terminal of each corresponding scannable flip-flops 26–29. In response to clock signal CLOCK, the scannable flip-flops 26–29 will shift the bits of information through the series of scannable flip-flops and that information, labeled TDO, is scanned out through the last scannable flip-flop 29 at scan out terminal SO.

If the scan chain 10 is included on a memory having scan ports or JTAG (joint test action group), the JTAG boundary scan chain can be used to scan out the fuse information included in the plurality of fuse circuits 20 to indicate any desired type of information that has been programmed into the fuses. This information may include, for example, whether redundancy is being used and the addresses of rows and/or columns that were repaired. In addition, other information, such as wafer lot, die position on a wafer, wafer parametrics, etc. can be stored in the fuses for use in analyzing yield and in performing failure mode analysis without destroying the integrated circuit memory.

FIG. 2 illustrates, in partial schematic diagram form and partial logic diagram form, fuse circuit 21 of scan chain 10 of FIG. 1. Fuse circuit 21 includes fusible link 89, N-channel transistors 91 and 93, and inverters 95 and 97. In the illustrated embodiment, fusible link 89 is a laser severable polysilicon fuse. In other embodiments, fusible link 89 can be any type of conductive material. In general, when fusible link 89 is severed, or blown, fuse circuit 21 provides a logic low output signal labeled "D" to the "D" terminal of scannable flip-flop 26, and when fusible link 89 is not blown, fuse circuit 21 provides a logic high output signal D to the "D" terminal of scannable flip-flop 26. Each of the other fuse circuits illustrated in FIG. 1 are similar to fuse circuit 21. In other embodiments, fuse circuit 21 may include electrically blown fuses.

Fusible link 89 has a first terminal connected to a power supply voltage terminal labeled "VDD", and a second terminal. N-channel transistor 91 has a first current electrode (drain) connected to the second terminal of fusible link 89, a control electrode (gate) connected to $V_{DD}$, and a second current electrode (source) connected to a second power supply voltage terminal labeled "$V_{SS}$". N-channel transistor 93 has a drain connected to the drain of N-channel transistor 91, a gate, and a source connected to $V_{SS}$. Inverter 95 has an input terminal connected to the drains of N-channel transistors 91 and 93, and an output terminal connected to the gate of N-channel transistor 93. Inverter 97 has an input terminal connected to the output terminal of inverter 95, and an output terminal for providing output signal D.

In operation, when fusible link 89 is not severed (programmed logic high), $V_{DD}$ is provided to the input terminal of inverter 95, causing inverter 95 to output a logic low. N-channel transistor 93 is substantially non-conductive, and inverter 97 provides a logic high output signal D. When fusible link 89 is laser blown, or severed (programmed logic low), N-channel transistor 91 reduces the voltage at the input terminal of inverter 95 to a logic low. N-channel transistor 91 is biased on, and functions as a relatively weak pull-down transistor. Inverter 95 provides a logic high output to the gate of N-channel transistor 93 and to the input terminal of inverter 97. N-channel transistor 93 is conductive, and ensures that the input terminal remains a logic low voltage. Inverter 97 provides logic low output signal D.

Figure 3:
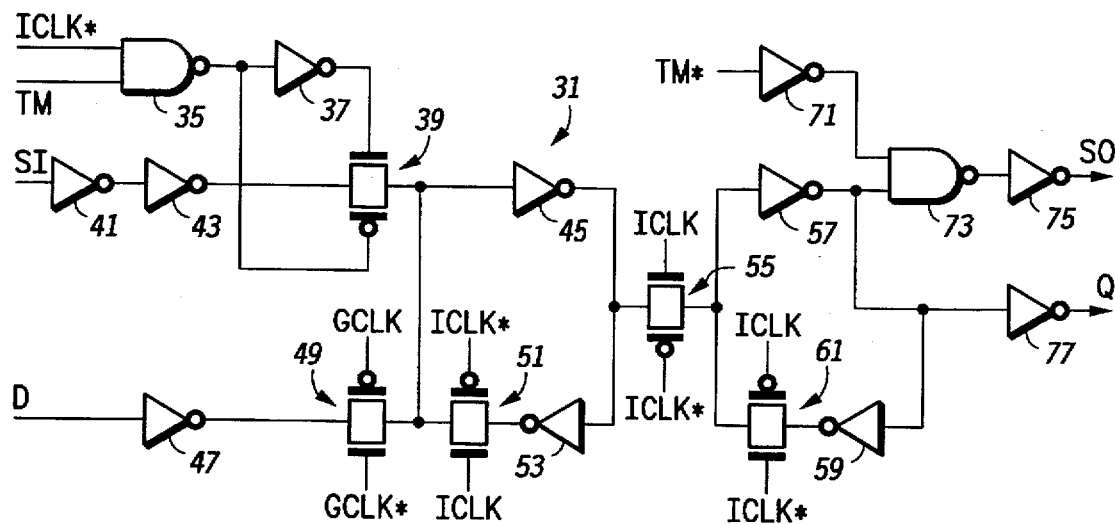
FIG. 3 illustrates, in partial schematic diagram form and partial logic diagram form, a scannable flip-flop of the scan chain of FIG. 1.
Figure 3:
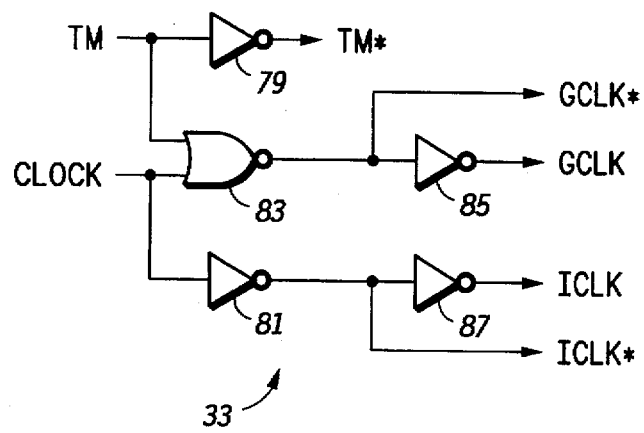

FIG. 3 illustrates, in partial schematic diagram form and partial logic diagram form, scannable flip-flop 26 of scan chain 10 of FIG. 1. Scannable flip-flop 26 includes flip-flop circuit 31 and timing generator 33. Flip-flop circuit 31 includes NAND logic gates 35 and 73, inverters 41, 43, 45, 47, 53, 57, 59, 75, and 77, and transmission gates 39, 49, 51, 55, and 61. Timing generator 33 includes inverters 79, 81, 85, and 87, and NOR logic gate 83.

In flip-flop circuit 31, NAND logic gate 35 has a first input terminal for receiving a clock signal labeled "ICLK*", a second input terminal for receiving test mode signal TM, and an output terminal. Inverter 37 has an input terminal connected to the output terminal, and an output terminal. Inverter 41 has an input terminal for receiving scan-in signal SI, and an output terminal. (Note that an asterisk (*) after a signal name indicates that the signal is a logical complement of a signal having the same name but lacking the asterisk.) Inverter 43 has an input terminal connected to the output terminal of inverter 41, and an output terminal. Transmission gate 39 has an input terminal connected to the output terminal of inverter 43, a first control terminal connected to the output terminal of inverter 37, a second control terminal connected to the output terminal of NAND logic gate 35, and an output terminal. Inverter 45 has an input terminal connected to the output terminal of transmission gate 39, and an output terminal. Inverter 47 has an input terminal for receiving output signal D from fuse circuit 21, and an output terminal. Transmission gate 49 has an input terminal connected to the output terminal of inverter 47, a first control terminal for receiving a clock signal labeled "GCLK", a second control terminal for receiving a clock signal labeled "GCLK*", and an output terminal. Transmission gate 51 has an output terminal connected to the output terminal of transmission gate 49 and to the input terminal of inverter 45, a first control terminal for receiving clock signal ICLK*, a second control terminal for receiving a clock signal labeled "ICLK", and an input terminal. Inverter 53 has an input terminal connected to the output terminal of inverter 45, and an output terminal connected to the input terminal of transmission gate 51.

Transmission gate 55 has an input terminal connected to the output terminal of inverter 45, a first control terminal for receiving clock signal ICLK, a second control terminal for receiving clock signal ICLK*, and an output terminal. Inverter 57 has an input terminal connected to the output terminal of transmission gate 55, and an output terminal. Inverter 71 has an input terminal for receiving a test mode signal labeled "TM*", and an output terminal. NAND logic gate 73 has a first input terminal connected to the output terminal of inverter 71, a second input terminal connected to the output terminal of inverter 57, and an output terminal. Inverter 75 has an input terminal connected to the output terminal of NAND logic gate 73. Inverter 77 has an input terminal connected to he output terminal of inverter 57, and an output terminal for providing output signal Q. Inverter 59 has an input terminal connected to the output terminal of inverter 57, and an output terminal. Transmission gate 61 has an input terminal connected to the output terminal of inverter 59, a first control terminal for receiving clock signal ICLK, a second terminal for receiving clock signal ICLK*, and an output terminal connected to the input terminal of inverter 57.

In timing generator 33, inverter 79 has an input terminal for receiving test mode signal TM, and an output terminal for providing test mode signal TM*. NOR logic gate 83 has a first input terminal for receiving test mode signal TM, a second input terminal for receiving clock signal CLOCK, and an output terminal for providing clock signal GCLK*. Inverter 85 has an input terminal connected to the output terminal of NOR logic gate 83, and an output terminal for providing clock signal GCLK. Inverter 81 has an input terminal connected to the input terminal of NOR logic gate 83, and an output terminal for providing clock signal ICLK*. Inverter 87 has an input terminal connected to the output terminal of inverter 81, and an output terminal for providing clock signal ICLK.

In operation, scannable flip-flop 26 may be used as part of the normal scan chain, such as JTAG, and provides the programmed information from the plurality of fuse circuits 20 as output scan data.

Timing generator 33 receives clock signal CLOCK and test mode signal TM. When test mode signal TM is a logic low, then clock signals GCLK and ICLK will have the same logic state as clock signal CLOCK. When test mode signal TM is a logic high, clock signal ICLK will have the same logic state as clock signal CLOCK and clock signal GCLK is a logic high. As illustrated in FIG. 3, timing generator 33 is used to control transmission gates 39, 49, 51, 55, and 61.

When test mode signal TM is a logic high and clock signal ICLK is a logic low, scan in data SI is provided to cross-coupled inverters 45 and 53. Scan in data SI is received and buffered by inverters 41 and 43. Because clock signal ICLK* is a logic high, transmission gate 39 is conductive and transmission gate 51 is substantially non-conductive, so scan in data SI is provided to the input terminal of inverter 45 and latched when clock signal ICLK transitions to a logic high. Because clock signal GCLK is a logic high, transmission gate 49 is substantially non-conductive. Clock signal ICLK* becomes a logic low causing transmission gate 51 to be conductive. The logic value provided through scan in terminal SI is latched in cross-coupled inverters 45 and 53. Transmission gate 55 is conductive allowing the scan in data to be provided to the input terminal of inverter 57. Transmission gate 61 is substantially non-conductive, allowing inverter 57 to change logic states if necessary. The output of inverter 57 is provided to the second input terminal in NAND logic gate 73 and also to the first input terminal of inverter 59. Since test mode signal TM* is a logic low, NAND logic gate 73 acts as an inverter allowing the output terminal of NAND logic gate 73 to toggle each time the logic state at the second input terminal of NAND logic gate 73 changes. The logic state of scan out data SO corresponds to the logic state of the scan in data SI that was acquired one clock cycle earlier. When clock signal ICLK transitions to a logic low, the current logic state of the cross-coupled inverters 57 and 59 is latched.

When test mode signal TM is a logic low, transmission gate 39 is substantially non-conductive, preventing scan in data SI from being provided to the cross-coupled latch having inverters 45 and 53. Clock signal GCLK is a logic low and clock signal GCLK* is a logic high. Transmission gate 49 is conductive and predetermined fuse information from fuse circuits 21, 22, 23, and 24, illustrated in FIG. 1, can then be provided to the cross-coupled latch (inverters 45 and 53). When clock signal ICLK becomes a logic high, clock signal ICLK* becomes a logic low. Transmission gate 51 becomes conductive, latching the fuse information provided at input terminal D at the same time transmission gate 55 is conductive, causing data corresponding to information at input terminal D to be provided to the latch comprising inverters 57 and 59. Transmission gate 61 is substantially non-conductive and inverter 57 changes logic states, if necessary, to provide data corresponding to the input data at the input terminal of inverter 59. When test mode signal TM* is a logic high, NAND logic gate 73 will always provide a logic high regardless of the logic state stored in the cross-coupled latch having inverters 57 and 59. Scannable flip-flop 26 has an advantage of integrating a flip-flop with a shift register, thus allowing it to be implemented using less surface area of the integrated circuit than if the flip-flop and shift register were implemented separately. Note that in other embodiments, inverters 41 and 75 may be deleted from the circuit.

Figure 4:
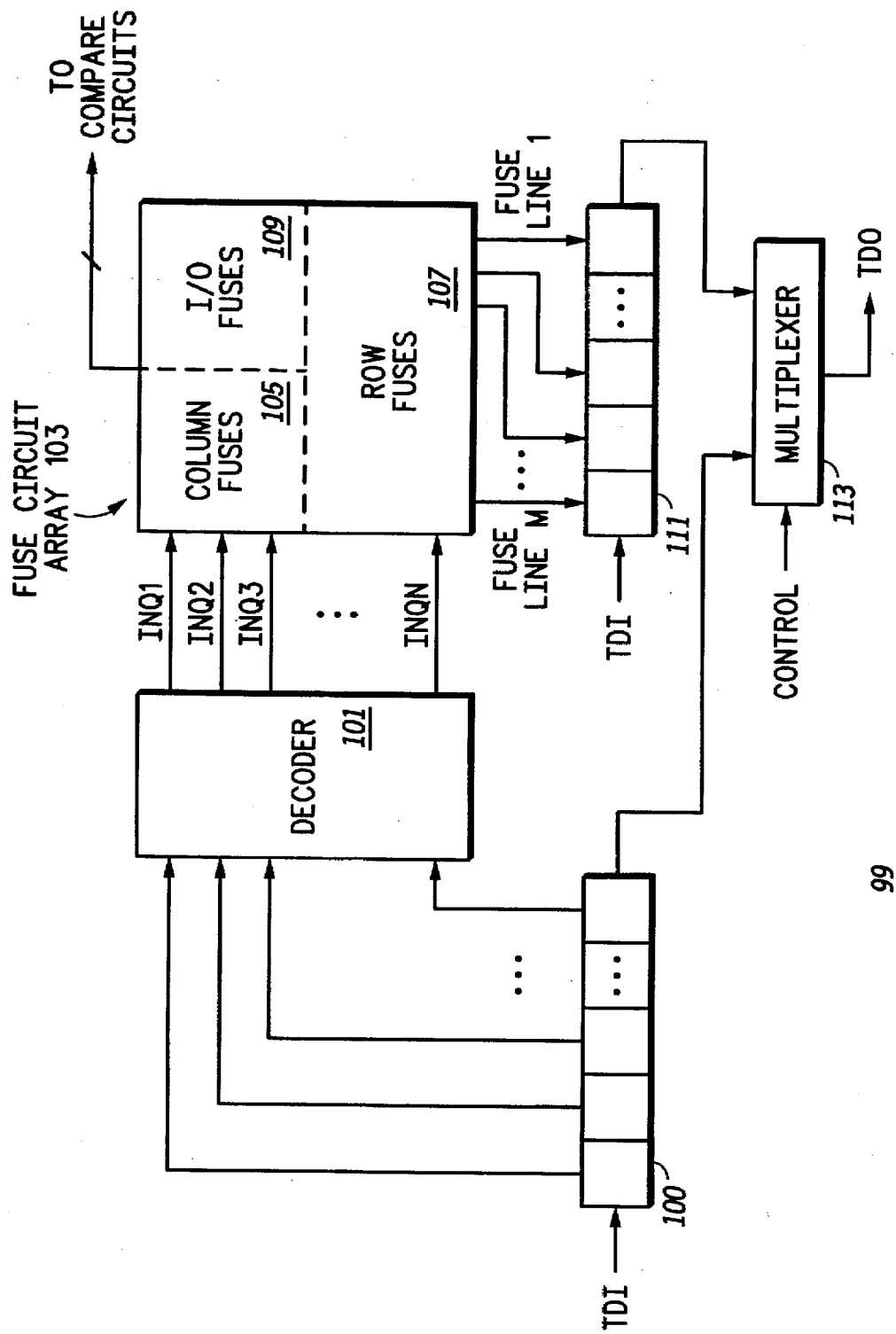
FIG. 4 illustrates, in block diagram form, a scan chain in accordance with another embodiment of the present invention.

FIG. 4 illustrates, in block diagram form, scan chain 99 in accordance with another embodiment of the present invention. Scan chain 99 includes shift register 100, decoder circuit 101, fuse circuit array 103, shift register 111, and multiplexer 113.

Shift register 100 is a conventional serial-in, parallel out, shift register. Shift register 100 has an input terminal for receiving a test data input signal labeled "TDI" and a plurality of output terminals. Decoder 101 has a plurality of input terminals connected to the plurality of output terminals of shift register 100 and a plurality of output terminals for providing decoded address signals labeled "INQ1"–"NQN". Fuse circuit array 103 includes column fuses 105, row fuses 107, and I/O fuses 109 which may be used to implement redundancy in, for example, a static random access memory (SRAM). In the illustrated embodiment, fuse circuit array 103 is distributed around the periphery of an integrated circuit memory 140 (illustrated in FIG. 6). Fuse circuit array 103 has a plurality of input terminals for receiving the decoded address signals INQ1–INQN and a plurality of output terminals labeled "FUSE LINE 1"–"FUSE LINE N", and a second plurality of output terminals for providing fuse information to conventional redundancy comparison logic for implementing redundancy in the memory. FUSE LINE 1–FUSE LINE N are provided to a shift register 111 having parallel inputs and a serial output and includes a second input terminal for receiving test data input signal TDI. Note that shift register 111 may be a conventional shift register or a shift register having elements similar to scannable flip-flop 26 (illustrated in FIG. 3).

A multiplexer 113 has a first input terminal for receiving a control signal labeled "CONTROL", a second input signal coupled to an output terminal of shift register 100, and an output terminal connected to a serial output terminal of shift register 111, and an output terminal for providing test data out TDO. In operation, test data input signal TDI and test data out signal TDO are signals commonly used with a conventional JTAG implementation in an integrated circuit. An address signal is provided serially into shift register 100 to specify which row of fuse circuit array 103 is to provide stored information to shift register 111. Fuse circuit array 103 includes addressable fuse circuits that are provided for normally implementing redundancy in a memory. A fuse circuit of the fuse circuit array 103 is illustrated in more detail in FIG. 5. In response to receiving the address signal, a predetermined row corresponding to the address provides fuse information via the fuse lines to shift register 111 from a predetermined location of the fuse array 103. That information is then scanned, or shifted out of, shift register 111 via multiplexer 113 as test data out TDO. Test data out TDO is further buffered and provided to an external pin, and includes information regarding which columns or rows of an integrated circuit memory have been repaired and/or whether redundancy has been used in the integrated circuit memory.

The control signal CONTROL is provided externally by a TAP controller (not shown) and determines whether the information shifted out of register 111 is provided as test data out TDO. Also included in scan chain 99, but not illustrated, are additional circuits required for a conventional implementation of JTAG such as a manufacturer ID register, a by-pass register, an instruction register, etc. In an integrated circuit memory having boundary scan compliant with JTAG, additional information regarding redundancy or any other encoded information can be scanned out with a minimum of logic added to the integrated circuit memory. Also, additional fuses are not required since the fuses required to implement the redundancy are integrated into the JTAG boundary scan chain.

Figure 5:
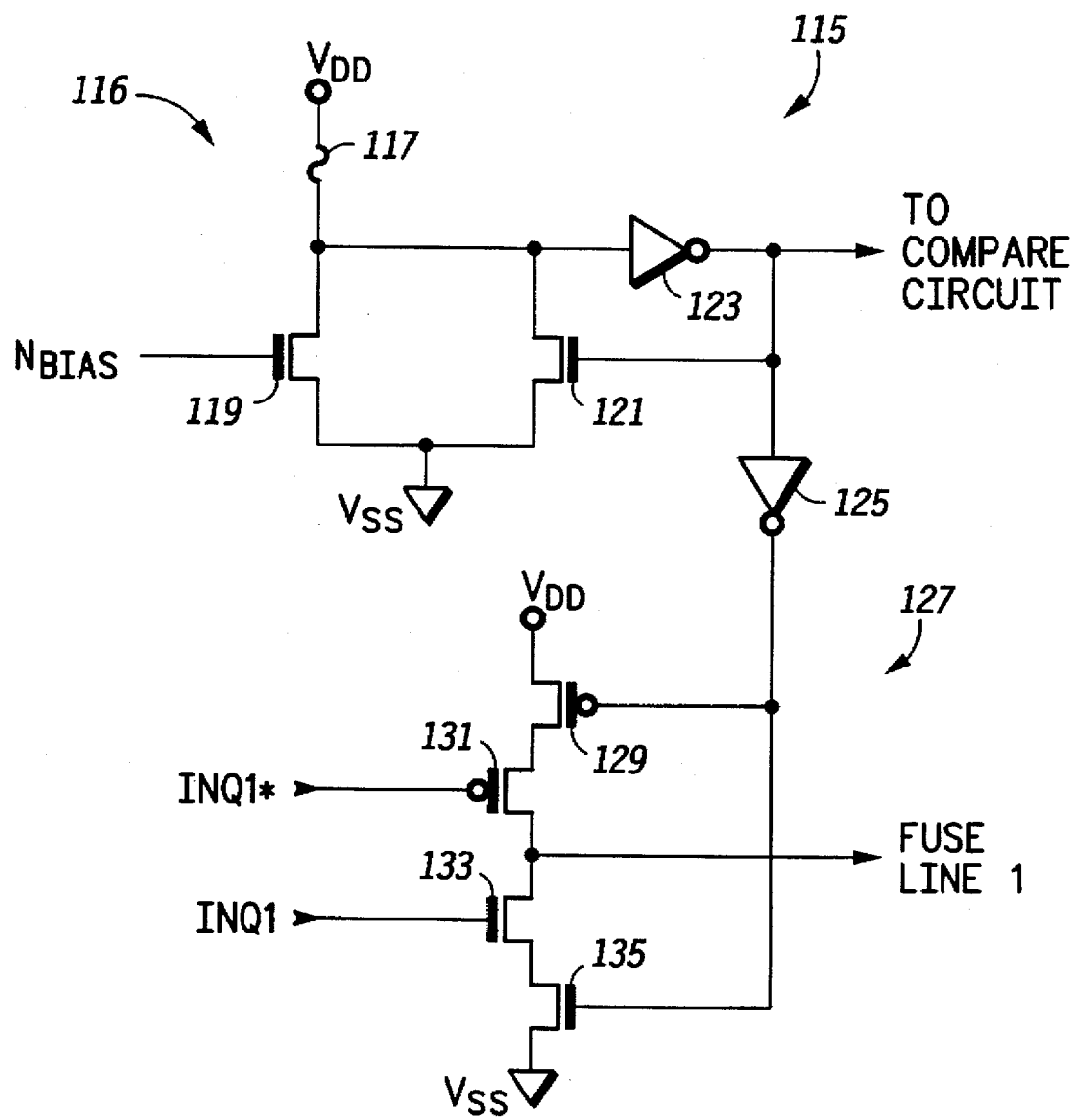
FIG. 5 illustrates, in partial schematic diagram form and partial logic diagram form, a fuse circuit of the scan chain of FIG. 4.

FIG. 5 illustrates a partial schematic diagram form and partial logic diagram form, a fused circuit 115 of scan chain 99 of FIG. 4. Fuse circuit 115 includes a fuse circuit portion 116 and a tri-state driver 127. Fuse circuit portion 116 includes fusible link 117, N channel transistors 119 and 121 and inverters 123 and 125. Fusible link 117 has a first terminal coupled to $V_{DD}$, and a second terminal. N-channel transistor 119 has a first current electrode coupled to the second terminal of fusible link 117. A control electrode for receiving a bias voltage labeled "$N_{BIAS}$" and a second current electrode connected to $V_{SS}$. N-channel transistor 121 has a first current electrode coupled to the second terminal of fusible link 117, a control electrode connected to the output terminal of inverter 123, and a second current electrode coupled to $V_{SS}$. Inverter 123 has an input terminal connected to the second terminal fusible link 117 and an output terminal. Inverter 125 has an input terminal connected to the output terminal of 123 and an output terminal. P-channel resistor 129 has a first current electrode connected to $V_{DD}$, a control electrode connected to the output terminal of inverter 125 and a second current electrode. P-channel transistor 131 has a first current electrode connected to the second current electrode of P-channel transistor 129, a current electrode for receiving address signal INQ1*, and a second current electrode for providing an output signal labeled "FUSE LINE 1". N-channel transistor 133 has a first current electrode connected to the second current electrode of P-channel transistor 131, a control electrode for receiving address signal INQ1, and a second current electrode. N-channel transistor 135 has a first current electrode connected to the second current electrode of N-channel transistor 133, a control electrode connected to the output terminal of inverter 125, and a second current electrode connected to $V_{SS}$.

In operation, fuse circuit portion 116 operates substantially the same as the fuse circuit illustrated in FIG. 2. Tri-state driver 127 receives fuse information from fuse circuit portion 116 which has been buffered by inverter 125. In response to receiving the decoded address signals INQ1 and INQ1*, an output signal, labeled FUSE LINE 1, corresponding to the fuse information is provided to a corresponding input terminal of shift register 111 illustrated in FIG. 4.

When the output of inverter 125 is a logic high, P-channel transistor 129 is substantially non-conductive and N-channel transistor 135 is conductive. If address signal INQ1 is a logic high, N-channel transistor 133 is conductive causing FUSE LINE 1 to be reduced to a logic low. Conversely, if the output of inverter 125 is a logic low, N-channel transistor 135 is substantially non-conductive and P-channel transistor 129 is conductive. When address signal INQ1 is a logic high, P-channel transistor 131 is conductive, N-channel transistor 133 is conductive, allowing FUSE LINE 1 to be increased to a logic high equal to approximately $V_{DD}$. In the illustrated embodiment, $V_{DD}$ is equal to about 3.3 volts and $V_{SS}$ is connected to ground. When address signal INQ1* is a logic high, P-channel transistor 131 is substantially non-conductive. Address signal INQ1 is a logic low and N-channel transistor 133 is substantially non-conductive presenting a high impedance to FUSE LINE 1.

Figure 6:
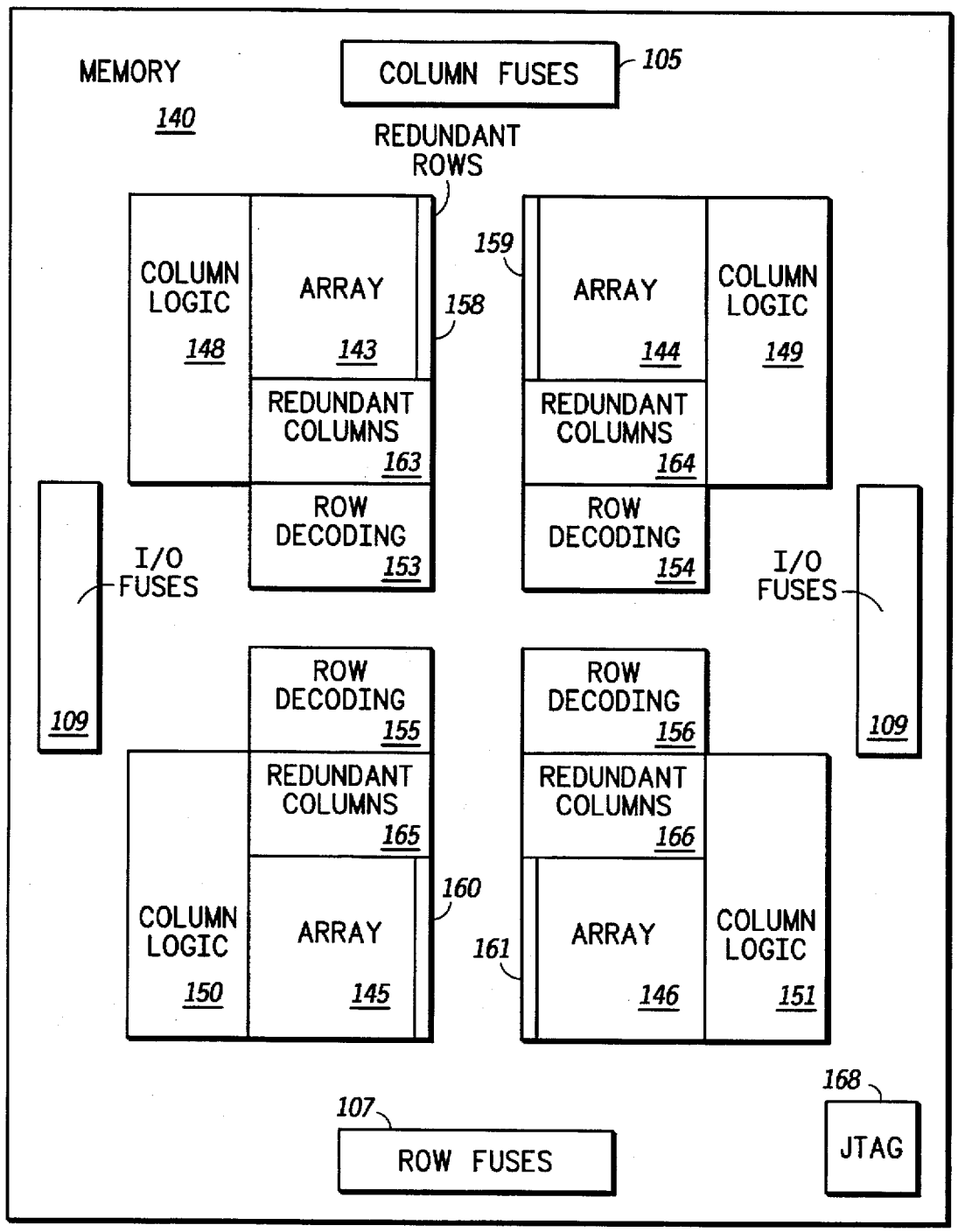
FIG. 6 illustrates, in block diagram form, a memory incorporating the scan chain of FIG. 4.

FIG. 6 illustrates in block diagram form an integrated circuit memory 140 incorporating scan chain 99 of FIG. 4. Integrated circuit memory 140 includes memory arrays 143–146, column logic 148–151, row decoding 153–156, redundant columns 163–166, redundant rows 150–161, and JTAG boundary scan test area 168. Integrated circuit memory 140 operates as a conventional SRAM with redundancy. Each of memory arrays 143–146 includes a plurality of memory cells organized in rows and columns. In response to receiving a row address and a column address, memory arrays 143–146 provide output data corresponding to the selected portions of memory arrays 143–146. In order to increase production yield, a plurality of redundant columns and/or redundant rows are provided to integrated circuit memory 140. The redundant rows and columns are used to replace defective rows or columns in their corresponding memory array. The redundancy is implemented using fusible links such as column fuses 105, row fuses 107, and I/O fuses 109 which are illustrated in FIG. 4.

As illustrated in FIG. 6, fuse circuit array 103 is distributed around the periphery of integrated circuit memory 140. As illustrated in FIG. 4, shift register 111 receives signals from each of the fuses located in fuse circuit array 103. Shift register 111 is also distributed around the periphery of integrated circuit memory 140 to position corresponding portions of the shift register 111 with each of column fuses 105, row fuses 107, or I/O fuses 109. The other circuits illustrated in FIG. 4 are located in or near the JTAG area 168.

By distributing shift register 111, and co-locating it with its corresponding fuses, reduces the number of metal lines that are required to be routed across integrated circuit memory 140.

Fuse circuit array 103 is organized, as illustrated in FIG. 4, in N-rows by M-columns (N×M), where N and M are integers. By organizing the fuse circuits as an array and selectively decoding the fuses to provide output data in M columns, the number of shift registers required in shift register 111 is reduced to M. This decreases the area required to implement the shift registers for scanning out the fuse information, thereby decreasing the size of the integrated circuit memory.

While the invention has been described in the context of a preferred embodiment, it will be apparent to those skilled in the art that the present invention may be modified in numerous ways and may assume many embodiments other than that specifically set out and described above. For example, the illustrated embodiment may be incorporated with another scan mechanism other than JTAG, or may be used as a stand-alone scan chain. Accordingly, it is intended by the appended claims to cover all modifications of the invention which fall within the true spirit and scope of the invention.

What is claimed is:

1. An integrated circuit memory implementing a scan test, comprising:
   a plurality of fuse circuits for storing predetermined information concerning the integrated circuit memory; and
   a plurality of latch circuits, coupled to the plurality of fuse circuits, each fuse circuit of the plurality of fuse circuit coupled to a corresponding one of the plurality of latch circuits, the plurality of latch circuits serially coupled to form a scan chain for selectively providing the predetermined information when the integrated circuit memory is in a test mode.

2. The integrated circuit memory of claim 1, wherein a fuse circuit of the plurality of fuse circuits comprises:
   a fusible link having a first terminal coupled to a first supply voltage terminal, and a second terminal;
   a first transistor having a first current electrode coupled to the second terminal of the fusible link, a control electrode for receiving a bias voltage, and a second current electrode coupled to a second supply voltage terminal;
   a second transistor having a first current electrode coupled to the second terminal of the fusible link, a control electrode, and a second current electrode coupled to the second supply voltage terminal; and
   a first inverter having an input terminal coupled to the second terminal of the fusible link, and an output terminal coupled to the control electrode of the second transistor.

3. The integrated circuit memory of claim 2, wherein the fuse circuit further comprises:
   a second inverter having an input terminal coupled to output terminal of the first inverter, and an output terminal;
   a third transistor having a first current electrode coupled to the first supply voltage terminal, a control electrode coupled to the output terminal of the second inverter, and a second current electrode;
   a fourth transistor having a first current electrode coupled to the second current electrode of the third transistor, a control electrode for receiving a first input signal, and a second current electrode;
   a fifth transistor having a first current electrode coupled to the second current electrode of the fourth transistor, a control electrode for receiving a second input signal, and a second current electrode for providing the predetermined information; and
   a sixth transistor having a first current electrode coupled to the second current electrode of the fifth transistor, a control electrode coupled to the output terminal of the second inverter, and a second current electrode coupled to the second supply voltage terminal.

4. The integrated circuit memory of claim 2, wherein the fusible link is a laser blowable fusible link.

5. The integrated circuit memory of claim 1, wherein a latch circuit of the plurality of latch circuits comprises a flip-flop circuit having a first input terminal coupled to the fuse circuit for receiving a portion of the predetermined information, a second input terminal for receiving a test data in signal, a third input terminal for receiving a test mode signal, a fourth input terminal for receiving a clock signal, and an output terminal for providing a scan out signal representative of one of the predetermined information or the test data in signal in response to the test mode signal.

6. The integrated circuit memory of claim 1, further comprising:
   a shift register having an input terminal for receiving a shifted-in test data in signal, a plurality of serially connected registers, and a plurality of output terminals for providing an address signal;
   a decoder circuit coupled to the shift register, for receiving the address signal, and in response, providing a decoded address signal;
   wherein the the plurality of fuse circuits are addressable fuse circuits for providing the predetermined information in response to the decoded address signal; and
   wherein the plurality of latch circuits are for receiving in parallel the predetermined information, and serially shifting the predetermined information from the addressable fuse circuits, and for providing the shifted predetermined information in response to the integrated circuit memory being in the test mode.

7. The integrated circuit memory of claim 6, wherein the addressable fuse circuits are arranged as an N×M bit fuse array, where N and M are integers, and the plurality of latch circuits receive M bits in parallel from a predetermined location of the addressable fuse circuits depending on the decoded address signal.

8. The integrated circuit memory of claim 1, wherein the predetermined information is redundancy information.

9. An integrated circuit memory with redundancy, comprising:
   a shift register having an input terminal for receiving an input signal, a plurality of serially connected registers, and an output terminal for providing an address signal;
   a decoder circuit coupled to the shift register, for receiving the address signal, and in response, providing a decoded address signal;
   a plurality of addressable fuse circuits, for providing stored fuse information in response to the decoded address signal, the stored fuse information including predetermined information concerning the integrated circuit memory; and
   a plurality of serially connected latch circuits forming a scan chain, each latch circuit correspondingly, coupled to one of the addressable fuse circuits, for providing the stored fuse information in response to the integrated circuit memory being in a test mode.

10. The integrated circuit memory of claim 9, wherein each of the addressable fuse circuits comprises:
   a fusible link having a first terminal coupled to a first supply voltage terminal, and a second terminal;
   a first transistor having a first current electrode coupled to the second terminal of the fusible link, a control electrode for receiving a bias voltage, and a second current electrode coupled to a second supply voltage terminal;
   a second transistor having a first current electrode coupled to the second terminal of the fusible link, a control electrode, and a second current electrode coupled to the second supply voltage terminal;
   a first inverter having an input terminal coupled to the second terminal of the fusible link, and an output terminal coupled to the control electrode of the second transistor;
   a second inverter having an input terminal coupled to output terminal of the first inverter, and an output terminal;
   a third transistor having a first current electrode coupled to the first supply voltage terminal, a control electrode coupled to the output terminal of the second inverter, and a second current electrode;

a fourth transistor having a first current electrode coupled to the second current electrode of the third transistor, a control electrode for receiving a first input signal, and a second current electrode;

a fifth transistor having a first current electrode coupled to the second current electrode of the fourth transistor, a control electrode for receiving a second input signal, and a second current electrode for providing the predetermined information; and a sixth transistor having a first current electrode coupled to the second current electrode of the fifth transistor, a control electrode coupled to the output terminal of the second inverter, and a second current electrode coupled to the second supply voltage terminal.

11. The integrated circuit memory of claim 9, wherein the addressable fuse circuits are assigned as an N×M bit fuse array, where N and M are integers, and the plurality of latch circuits receive M bits in parallel from a predetermined location of the addressable fuse circuits depending on the decoded address signal.

12. The integrated circuit memory of claim 11, wherein the N×M bit fuse array is distributed around a periphery of the integrated circuit memory.

13. The integrated circuit memory of claim 9, wherein the latch circuit comprises a first input terminal coupled to the addressable fuse circuit for receiving the stored fuse information, a second input terminal for receiving a test data in signal, a third input terminal for receiving a test mode signal, a fourth input terminal for receiving a clock signal, and an output terminal for providing a scan out signal representative of one of the predetermined information or the test data in signal in response to the test mode signal.

14. An integrated circuit memory with redundancy, the integrated circuit memory implementing a boundary-scan test according to a Joint Test Action Group (JTAG) boundary-scan standard, comprising:

a plurality of memory cells organized in rows and columns;

a redundant column of memory cells for replacing a defective column of the plurality of memory cells;

a plurality fuse of circuits for storing redundancy information, the redundancy information for addressing the redundant column of memory cells when the redundant column of memory cells replaces the defective column of the plurality of memory cells; and a plurality of serially connected latch circuits to form a scan chain, each latch circuit, coupled to a corresponding one of the fuse circuits for selectively providing the redundancy information when the integrated circuit memory is in a test mode.

15. The integrated circuit memory of claim 14, wherein a latch circuit of the plurality of latch circuits comprises a flip-flop circuit having a first input terminal coupled to the fuse circuit for receiving a portion of the redundancy information, a second input terminal for receiving a test data in signal, a third input terminal for receiving a test mode signal, a fourth input terminal for receiving a clock signal, and an output terminal for providing a scan out signal representative of one of the redundancy information or the test data in signal in response to the test mode signal.

16. The integrated circuit memory of claim 14, further comprising:

a shift register having an input terminal for receiving a shifted-in test data in signal, a plurality of serially connected registers, and a plurality of output terminals for providing an address signal;

a decoder circuit coupled to the shift register, for receiving the address signal, and in response, providing a decoded address signal;

wherein the plurality fuse circuits are an addressable fuse circuits for providing the redundancy information in response to the decoded address signal; and wherein the plurality latch circuits are for receiving in parallel and serially shifting the redundancy information from the addressable fuse circuits, and for providing the shifted redundancy information in response to the integrated circuit memory being in the test mode.

17. The integrated circuit memory of claim 16, wherein the addressable fuse circuits are arranged as an N×M bit fuse array, where N and M are integers, and the plurality of latch circuits receive M bits in parallel from a predetermined location of the addressable fuse circuits depending on the decoded address signal.

18. The integrated circuit memory of claim 17, wherein the N×M bit fuse array is distributed around a periphery of the integrated circuit memory.

* * * * *